United States Patent [19]

Pearce

[11] Patent Number: 4,651,131
[45] Date of Patent: Mar. 17, 1987

[54] APPARATUS FOR CONVERTING AN ANALOGUE INPUT SIGNAL OF NARROW BANDWIDTH TO DIGITAL FORM

[75] Inventor: Timothy H. B. Pearce, Chelmsford, England

[73] Assignee: The General Electric Company plc, London, England

[21] Appl. No.: 807,784

[22] Filed: Dec. 11, 1985

[30] Foreign Application Priority Data

Dec. 15, 1984 [GB] United Kingdom ............... 8431705
Feb. 12, 1985 [GB] United Kingdom ............... 8503503

[51] Int. Cl.⁴ ............................................. H03M 1/20
[52] U.S. Cl. ................................ 340/347 AD; 375/27
[58] Field of Search ............ 340/347 AD; 375/25–34; 332/11 D; 364/487; 367/39, 40, 126; 324/99 D

[56] References Cited

U.S. PATENT DOCUMENTS

| | | | |
|---|---|---|---|
| 4,059,800 | 11/1977 | Jones | 340/347 AD |
| 4,179,659 | 12/1979 | Tashiro | 375/27 |
| 4,204,198 | 5/1980 | Filipov | 340/347 AD |
| 4,271,431 | 6/1980 | Steber | 375/27 |
| 4,532,494 | 7/1985 | Sasaki | 332/11 D |

FOREIGN PATENT DOCUMENTS 1463806 2/1977 United Kingdom .

Primary Examiner—Charles D. Miller
Attorney, Agent, or Firm—Spencer & Frank

[57] ABSTRACT

A narrow band signal is converted into digital form using an analogue to digital converter of relatively small capacity. The input signal is compared with a prediction of it based on previous cycles of the incoming waveform. This produces an error signal which is compared with a prediction of the error signal to produce an "error of the error" signal. A relatively small A/D converter converts this into 8 bit digital form and this is applied to a feedback loop consisting of an adder and delay to give a sixteen bit prediction of the error signal which is applied via D/A converter to the subtractor. The sixteen bit prediction also provides an input to a further adder forming part of a feedback loop to give an eighteen bit prediction of the input signal. The latter is applied via a D/A converter to a subtractor and is used as the system output.

6 Claims, 2 Drawing Figures

APPARATUS FOR CONVERTING AN ANALOGUE INPUT SIGNAL OF NARROW BANDWIDTH TO DIGITAL FORM

Figure 1:
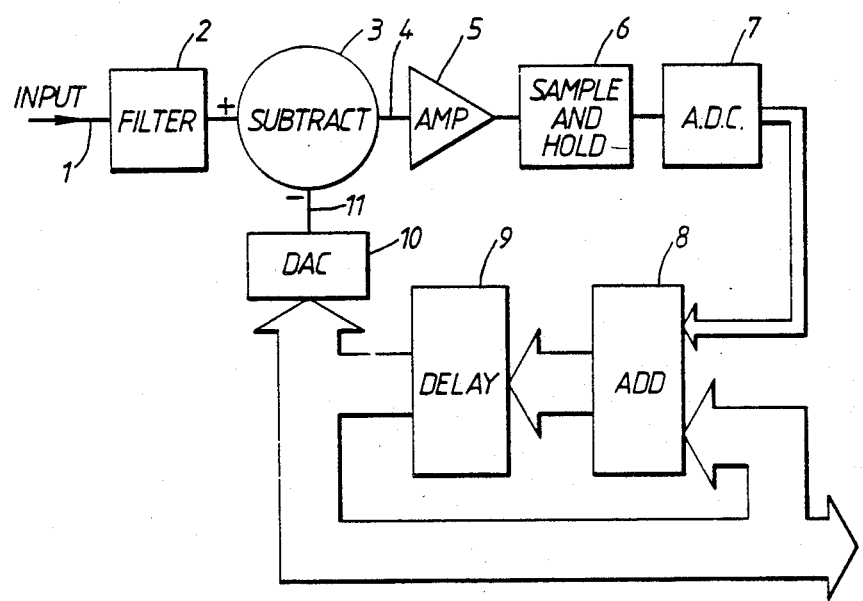

This invention relates to apparatus for converting an analogue input signal of narrow bandwidth to digital form. A method for doing this, based on a known principle is illustrated in FIG. 1. An input signal on line 1 is an IF carrier frequency of for example 2.5 MHz modulated by an audio signal. This passes through a bandpass filter 2 centred on the carrier frequency and is then subtracted at 3 from a feedback signal to provide an error signal on line 4. This is amplified at 5 and converted into digital form by a sample and hold circuit 6 and a conventional analogue to digital convertor 7. The analogue to digital convertor 7 operates at an integral multiple (in this case four) times the nominal frequency (2.5 MHz) of the input signal i.e., at 10 MHz. It has an eight bit output, this being the largest currently available capable of operating at the required speed.

The eight bit output of the analogue to digital converter 7 is passed to one input of an eighteen bit adder 8. The eighteen bit output of the adder 8 is passed to a delay 9 where it is delayed by one period of the nominal frequency of the input signal i.e., by four sample periods of the sample and hold circuit 6. The output of the delay 9 is passed to the second input of the adder 8 and to a digital to analogue converter 10 whose output is applied on line 11 to the subtractor 3.

In the arrangement of FIG. 1, because of the feedback from the output of the delay 9 to the input of the adder 8, the signal on line 11 tends towards a state where it is approximately equal to the input signal assuming that the input signal does not change to a large extent from one cycle to the next: an assumption which is correct in the case of a narrow bandwidth signal. The signal on line 11 can thus be considered to be a prediction of the input signal based on previous cycles of the carrier wave which are assumed to change only to a small extent from one cycle to the next. The signal on line 4 is thus an error signal representing the difference between the actual signal and the predicted signal.

It is notable that the arrangement of FIG. 1 is able to digitise the input signal into eighteen bit form using an analogue to digital converter of only eight bits. This is possible because the analogue to digital converter needs to digitise only an error signal and not the whole of the input signal.

The bandwidth of the input signal which the system of FIG. 1 can handle is limited by the fact that the error signal (which will be larger for a large bandwidth) must be represented by the eight bit output of the analogue to digital converter. This invention enables a wider bandwidth to be used whilst using no larger an analogue to digital converter.

The invention provides apparatus for converting an analogue input signal to narrow bandwidth to digital form comprising: an analogue to digital converter whose output has insufficient digits for the accuracy required; an adder having one input connected to receive the output of the analogue to digital converter; a delay device arranged to delay an output from the adder; means for using the delayed signal to provide a second input to the adder; means for providing an error signal from the input signal and the delayed signal; and means for feeding the error signal to the analogue to digital converter; characterised in that the means for providing the error signal includes a second adder having one input connected to receive the signal from the first adder, a second delay which receives the output of the second adder, means for feeding the output of the second delay to a second input of the second adder, a third adder connected to receive the outputs of the first and second adders, a digital to analogue converter connected to receive the output of the third adder, and means for subtracting the output of the digital to analogue converter from the input signal.

By employing the invention the error signal applied to the analogue to digital converter can be made much smaller for a given bandwidth, enabling a wider bandwidth signal to be passed for an analogue to digital converter of a given size.

The second and third adders are preferably arranged to receive the signal from the first adder via a tap on the first delay device. This enables delay introduced by the analogue to digital converter to be compensated for. Similarly the third adder can be connected to receive the output of the second adder via a tap on the second delay but it is preferred for the third adder to receive the output of the second adder directly as this achieves the widest bandwidth for the converter.

One particular advantage accruing from this invention is that the system produces a digital representation of the narrow band input signal with minimal phase or amplitude distortion.

One way in which the invention may be performed will now be described with reference to FIG. 2 of the accompanying drawings on which parts identical to those of FIG. 1 are denoted by identical reference numerals.

Figure 2:
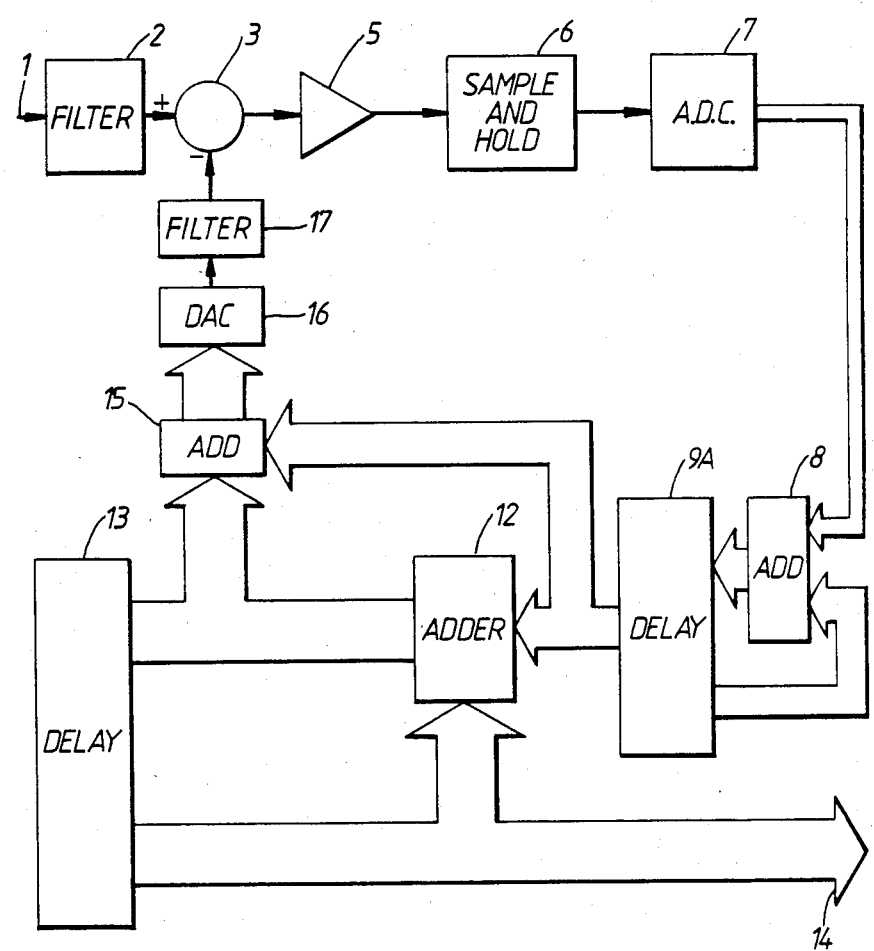

Referring now to FIG. 2, the sixteen bit output of adder 8 is passed to one end of a tapped delay line 9A whose other end is connected to the second input of adder 8 and which gives a total delay of four sample periods. The tap on the delay line 9A is connected to one input of a second adder 12 having an eighteen bit capacity whose output is subjected at 13 to a second delay, also of four sample periods. The difference in resolution required by the two adders (i.e., the sixteen bits of adder 8 and the eighteen bits of adder 12) arises because the first adder 8 and delay 9 handle the prediction error and the second adder and delay the prediction. The output of the delay 13 is used as the second input to the adder 12 and as the output 14 of the system. The output of adder 12 is added at 15 to the output of the tap on delay 9A and is then passed to an eighteen bit digital to analogue converter 16 whose output is filtered at 17 and this subtracted at 3 from the input signal. The output of the subtractor 3 is amplified at 5 and then passed to components 6, 7, and 8, identical to those shown in FIG. 1.

The purpose of the filter 17 is to remove the components associated with the sampling frequency, and its harmonics, resulting from the digital to analogue conversion process to leave only those components at the input signal frequency. This filter thus causes the subtractor to operate with two signals at or near the carrier frequency only, which reduces the rate of change of amplitude of its output relative to the circuit without the filter, thereby relaxing the timing accuracy on the sample and hold circuit 6. It is possible to increase the number of prediction loops if further resolution is required.

In a modified version of the circuit of FIG. 3 the resolution of the second and third adders 12 and 18, and the number of bits which the second delay 13 needs to be capable of handling, can be reduced to accomodate a digital to analogue converter 16 with only 12 bits resolution but having an accuracy on its output levels equal to 18 bits. With this modification the same accuracy can be achieved over the signal bandwidth as with the 18 bit digital to analogue converter described previously since advantage is being taken of the quantising noise-shaping property of the loop formed by the first adder 8 and first delay 9. A digital to analogue converter with this specification will be less expensive than a digital to analogue converter with full 18 bit resolution and the circuitry forming the second and third adders 12 and 18, and second delay 13 will also be simpler.

I claim:

1. Apparatus for converting an analogue input signal of narrow bandwidth to digital form comprising: an analogue to digital converter whose output has insufficient digits for the accuracy required; an adder having one input connected to receive the output of the analogue to digital converter; a delay device arranged to delay an output from the adder; means for using the delayed signal to provide a second input to the adder; means for providing an error signal from the input signal and the delayed signal; and means for feeding the error signal to the analogue to digital converter; characterised in that the means for providing the error signal includes a second adder having one input connected to receive the signal from the first adder, a second delay which receives the output of the second adder, means for feeding the output of the second delay to a second input of the second adder, a third adder connected to receive the outputs of the first and second adders, a digital to analogue converter connected to receive the output of the third adder, and means for subtracting the output of the digital to analogue converter from the input signal.

2. Apparatus according to claim 1 in which the second and third adders are arranged to receive the signal from the first adder via a lap on the first delay device.

3. Apparatus according to claim 2 in which the third adder receives the output of the second adder directly.

4. Apparatus according to claim 1 in which the third adder receives the output of the second adder directly.

5. Apparatus according to claim 1 including means for filtering the output of the digital to analogue converter, so as to remove sampling frequency components introduced during digital to analogue conversion.

6. Apparatus according to claim 1 in which the said second and third adders and second delay are reduced in resolution to accommodate a reduced resolution digital to analogue converter but with an accuracy of output levels equal to that of the full resolution to take advantage of the quantising noise-shaping properties of the loop formed by the first adder and first delay.

* * * * *